United States Patent [19]

Mochizuki

[11] Patent Number: 4,716,548

[45] Date of Patent: Dec. 29, 1987

[54] SEMICONDUCTOR MEMORY CELL

[75] Inventor: Tohru Mochizuki, Yokohama, Japan

[73] Assignee: Kabushiki Kaisha Toshiba, Kawasaki, Japan

[21] Appl. No.: 828,863

[22] Filed: Feb. 12, 1986

[30] Foreign Application Priority Data

| Feb. 13, 1985 | [JP] | Japan | 60-25689 |
| Mar. 28, 1985 | [JP] | Japan | 60-64434 |
| Mar. 30, 1985 | [JP] | Japan | 60-66809 |
| Mar. 30, 1985 | [JP] | Japan | 60-67055 |

[51] Int. Cl.$^4$ .............. G11C 11/00; G11C 11/24; G11C 11/34; H01L 29/78
[52] U.S. Cl. .................. 365/149; 365/150; 365/187; 357/236; 357/237; 357/59; 357/55; 357/41
[58] Field of Search ............ 365/149, 150, 187; 357/23.6, 23.7, 59 E, 55, 41

[56] References Cited

U.S. PATENT DOCUMENTS

| 3,614,749 | 10/1971 | Radcliffe | 365/149 |
| 4,168,536 | 9/1979 | Joshi et al. | 365/149 |
| 4,570,175 | 2/1986 | Miyao et al. | 357/23.7 |

FOREIGN PATENT DOCUMENTS 0108390 5/1984 European Pat. Off. .......... 357/55

OTHER PUBLICATIONS

Garnache, R. R. "Complimentary FET Memory Cell", IBM Technical Disclosure Bulletin, vol. 18, No. 12, May 1976, pp. 3947–3948.
Shinchijo et al., "Polysilicon Transistors in VLSI MOS Memories," IEDM, pp. 228–231, Dec. 9, 1984.
Sunami et al., "A Corrugated Capacitor Cell (CCC)," IEEE Transactions of Electron Devices, vol. ED-31, No. 6, Jun. 1984.

*Primary Examiner*—Martin H. Edlow
*Assistant Examiner*—Robert P. Limanek
*Attorney, Agent, or Firm*—Finnegan, Henderson, Farabow, Garrett & Dunner

[57] ABSTRACT

There is disclosed a semiconductor memory cell comprising a capacitor for storing charges between a data writing MOS transistor and a data reading MOS transistor.

18 Claims, 44 Drawing Figures

SEMICONDUCTOR MEMORY CELL

BACKGROUND OF THE INVENTION

This invention relates to a semiconductor memory cell suitable for memory cells of a dynamic RAM (random access memory).

A conventional memory cell used in the dynamic RAM as shown in FIG. 1 has been known. In the memory cell of FIG. 1, there are provided MOS transistor 1 for writing and reading out data and capacitor 2 for storing charges. One terminal of the source-drain path of the transistor is connected to a first electrode of capacitor 2. A second electrode of capacitor 2 is connected to bit line BL for data read and write. The gate of transistor 1 is connected to word line WL for data read and write. The second electrode of capacitor 2 is connected to a predetermined potential such as ground potential. To improve packing density of the memory device, further miniaturization is required for the cell. With this requirement, the capacitor must also be miniaturized. To increase the capacitance without increasing the capacitor area on the chip, a so-called trench capacitor is employed for capacitor 2.

The structure of the memory cell in FIG. 1 is illustrated in FIG. 2. Semiconductor regions 12 and 13 of $N^{30}$ conductivity type are formed in the surface region of semiconductor substrate 11 of P conductivity type. Regions 12 and 13 form the source and drain regions of transistor 1, respectively. Trench 14 is formed at a predetermined location of substrate 11. Silicon oxide film 15, which serves as a dielectric and has a fixed thickness, is layered on the inner surface of trench 14. Polysilicon layer 16 is deposited on silicon oxide film 15. Polysilicon layer 16 forms the first electrode of capacitor 2. Reference numeral 17 designates the gate insulative film of transistor 1. Reference number 18 designates the gate electrode of transistor 1, and also serves as word line WL. Numeral 19 represents metal bit line BL made of aluminum, for example. Numeral 20 represents a field oxidation film for separating element regions. Capacitor 2 is formed in semiconductor substrate 11 in the form of the trench capacitor. With this structure of capacitor 2, the capacitor has a large capacitance although it occupies a small area on the chip.

The memory cell of a one transistor/one capacitor type as shown in FIGS. 1 and 2 has no problem in the data write operation, but is sensitive to noise in the data read out operation. The data read out operation is performed in a manner that the charges stored in capacitor 2 are read out onto bit line BL. The charges flow through two capacitors, capacitor 2 and parasitic capacitor 3 associated with bit line BL. Assuming that the capacitance of capacitor 2 is Cs and the capacitance of parasitic capacitor 3 is Cb, potential $V_{BL}$ on bit line BL is given as:

$$V_{VL} = Cb/(Cs + Cb).$$

Usually in the semiconductor memory, a number of memory cells are connected to bit line BL. Therefore, capacitance Cb is larger than capacitance Cs, and Cb/Cs is about 20. For this reason, the potential of data, i.e. charges written into capacitor 2 by applying 5 V to bit line BL, decreases to 0.25 V or less when it is read out. This minute potential is sensed by a sense amplifier (not shown) connected to bit line BL.

As the number of memory cells connected to bit line BL increases, the capacitance of parasitic capacitor 3 increases. As the size of each element is further decreased, the capacitance of capacitor 2 is decreased, and hence the potential $V_{BL}$ detected is made smaller. This fact causes a serious problem in increasing the packing density.

To cope with this problem, there has been proposed a two-transistor dynamic memory cell of the current read out type, as shown in FIG. 3. When compared with the memory cell shown in FIGS. 1 and 2, in this type of memory cell, capacitor 2 is removed, while MOS transistor 4 for reading out data is added. One terminal of the source-drain path of transistor 4 is coupled with bit line BL, the other of them to word line RW. The gate of transistor 4 is coupled with one terminal of the source-drain path of transistor 1. The gate of transistor 1 is connected to word line WW for writing data.

In operation, when a write signal is applied to word line WW, transistor 1 is turned on, so that signal charges as data of logical "1" is held in the gate of transistor 4. For reading out data, a read signal is applied to word line RW. At this time, if signal charges have been stored in the gate of transistor 4, current is fed from word line RW to bit line BL through transistor 4. With this current, parasitic capacitor 3 is charged to increase the potential on bit line BL. The data is detected by sensing this potential by a sense amplifier. In the memory cell of prior art, two separate transistors 1 and 4 must be fabricated. As the result of the requirement of separate transistors fabrication, the area needed for these transistors is large, hindering packing density improvement.

SUMMARY OF THE INVENTION

Accordingly, an object of the present invention is to provide a semiconductor memory cell which has an increased amount of charges on a read-out bit line and may be fabricated at a high packing density.

According to this invention, there is provided a semiconductor memory cell comprising a bit line for writing data, a word line for writing data, a bit line for reading out data, a word line for reading out data, a MOS transistor for writing data, one terminal of the drain-source path of the MOS transistor being connected to said bit line for writing data, and the gate electrode of the MOS transistor being connected to said word line for writing data, a capacitor for storing charges, one electrode of the capacitor being connected to the other terminal of the drain-source path of the MOS transistor, and a MOS transistor for reading out data, one terminal of the drain-source path of the MOS transistor being connected to said bit line for reading out data, the other terminal of the drain-source path of the MOS transistor being connected to said word line for reading out data, and the gate electrode of the MOS transistor being connected to the other electrode of said capacitor.

According to this invention, there is further provided a semiconductor memory cell comprising a bit line for writing data and reading out data, a word line for writing data, a word line for reading out data, a MOS transistor for writing data, one terminal of the drain-source path of the MOS transistor being connected to said bit line, and the gate electrode of the MOS transistor being connected to said word line for writing data, a capacitor for storing charges, one electrode of the capacitor being connected to the other terminal of the drain-source path of the MOS transistor, and the other electrode of the capacitor being connected to a predetermined potential, and a MOS transistor for reading out data, one terminal of the drain-source path of the MOS transistor being connected to said bit line, the other terminal of the drain-source path of the MOS transistor being connected to said word line for reading out data, and the gate electrode of the MOS transistor being connected to said one electrode of said capacitor.

DETAILED DESCRIPTION OF THE PREFERRED EMBODIMENTS

Embodiments of this invention will be described referring to accompanying drawings.

Figure 1:
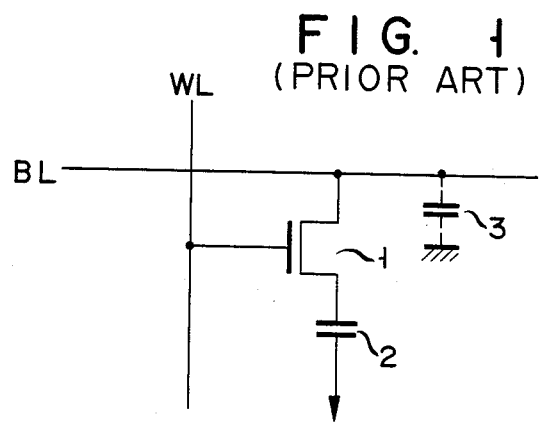
FIG. 1 is a circuit diagram of a conventional dynamic type semiconductor memory cell.
Figure 2:
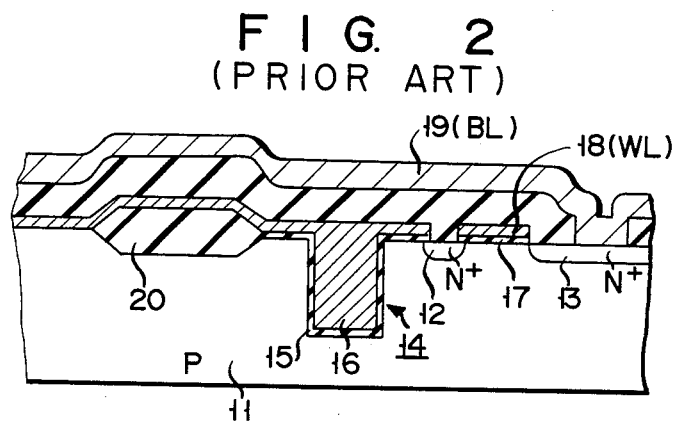
FIG. 2 shows a partial cross sectional view of the memory cell of FIG. 1.
Figure 3:
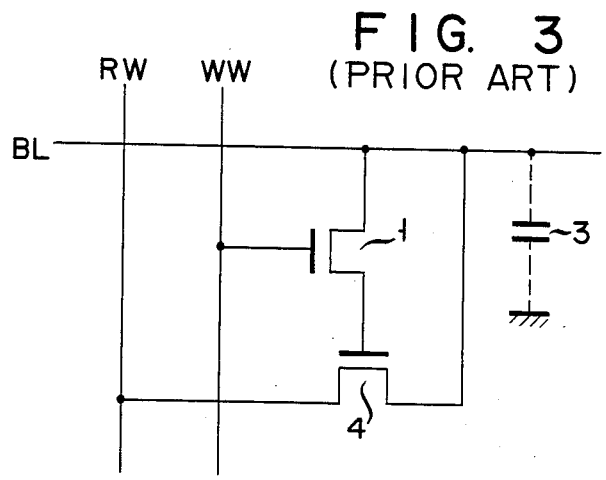
FIG. 3 is a circuit diagram of another conventional semiconductor memory cell of dynamic type.
Figure 4:
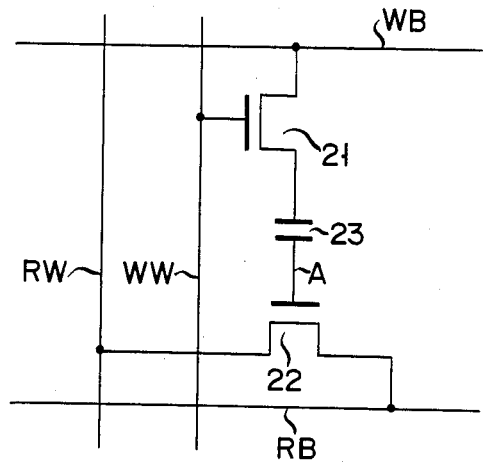
FIG. 4 is a circuit diagram of a memory cell according to one embodiment of this embodiment.

FIG. 4 shows a circuit diagram of a semiconductor memory cell according to one embodiment of the invention. In FIG. 4, WB and WW are representative of a bit line and a word line for writing data, respectively. RB and RW designate a bit line and a word line for reading out data. Reference numerals 21 and 22 indicate MOS transistors for data write and read, respectively. Reference numeral 23 is a capacitor for signal charge storage.

One terminal of the source-drain path of transistor 21 is connected to bit line WB, while the other terminal to one of the electrodes of parasitic capacitor 23. One terminal of the source-drain path of transistor 22 is connected to word line RW, while the other terminal to bit line RB. Its gate is connected to the electrode of parasitic capacitor 23.

The operation of the FIG. 4 memory cell will be given referring to FIGS. 5a to 5c through 8a to 8c.

Figure 5:
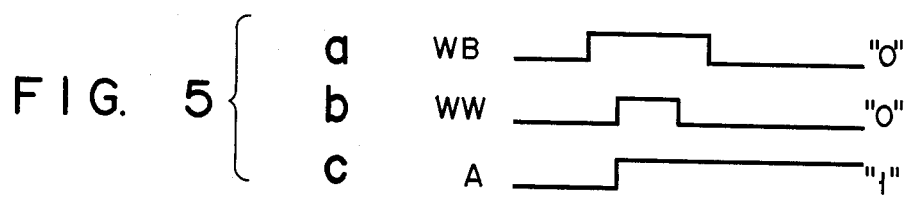
FIGS. 5a to 5c to FIGS. 8a to 8c show time charts illustrating the operation of the memory cell of FIG. 4.

The timing charts shown in FIGS. 5a to 5c illustrate the operation of the memory cell when logical "1" is written into the memory cell. This operation is as follows. During the write cycle, bit line WB is charged up to the potential $V_{WB}$, e.g., 5 V, corresponding to logical "1" (FIG. 5a). During a period that bit line WB is logical "1", word line WW is at 5 V (FIG. 5b). As a result, transistor 21 is turned on, and the electrode of capacitor 23 closer to transistor 21 is charged to 5 V. Since the other electrode of capacitor 23 is connected to the gate electrode of transistor 22, the gate potential Va of transistor 22 (potential at point A) is given by $$Va = \{Cs/(Cg+Cs)\}V_{WB}$$

where Cs is capacitance of capacitor 23 and Cg gate capacitance of transistor 22. If the circuit of the memory cell is designed so that Cs>>Cg, Va is $$Va \approx V_{WB}.$$

The write voltage 5 V is applied to the gate electrode transistor 22. So long as transistor 21 is in off state, the gate potential of transistor 21 is kept at 5 V. This indicates that logical "1" data is written into the memory cell.

Figure 6:
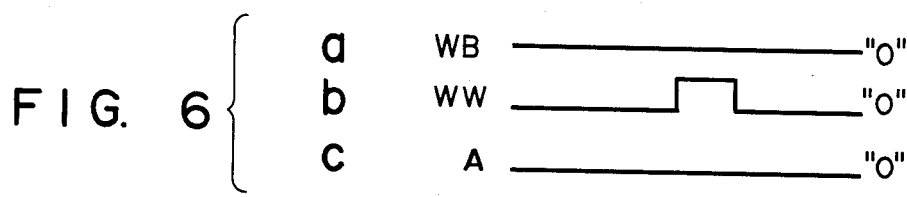

The timing charts shown in FIGS. 6a to 6c show the operation for writing logical "0" data into the memory cell. To write this data, potential $V_{WB}$ on bit line WB is set to 0 V (FIG. 6a). Word line WW is set to 5 V (FIG. 6b), and transistor 21 is turned on. Since bit line WB is at 0 V, no signal charge is stored in point A (FIG. 6c). In this way, logical "0" data is written into the memory cell.

Figure 7:
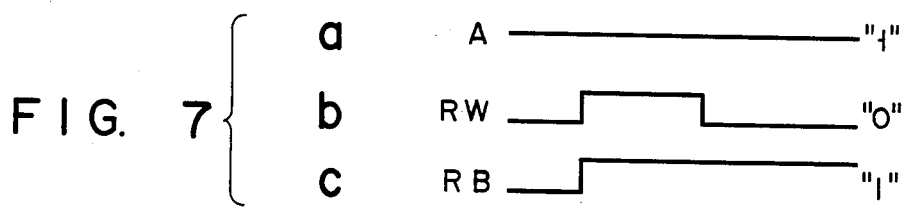

The data read out operation will be given. The timing charts to read out logical "1" data is illustrated in FIGS. 7a to 7c. In this case, the point A potential has been set to 5 V (FIG. 7a). During the read out cycle, word line RW is set at 5 V (FIG. 7b). Since transistor 22 is in on state, if word line RW is set at 5 V, current flows through transistor 22 to bit line RB (FIG. 7c). Then, bit line RB is charged to logical "1" to read out logical "1" data.

Figure 8:
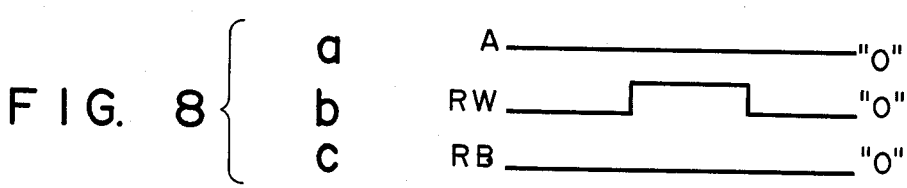

The timing charts shown in FIGS. 8a to 8c illustrate the operation of reading out logical "0" data from the memory cell. In this case, the point A potential is present to 0 V (FIG. 8), and transistor 22 is still in off state. In the read cycle, word line RW is set at 5 V (FIG. 8b). Under this condition, if word line RW is set at 5 V (8b), no current flows into bit line RB (FIG. 8c), and is still 0 V. This indicates that logical "0" data has been read out.

In this embodiment, the signal charge is not distributed into the capacitor for signal charge storage and the parasitic capacitor associated with the bit line, and read current flows from word line RW to bit line RB. Therefore, even if a number of memory cells are connected to the bit line, a sufficient amount of charges can be supplied to bit line RB under a condition that logical "1" is applied to word line RW. Therefore, data detection can be made insensitive to noise. If the capacitance of capacitor 23 is increased, the amount of charges stored therein may be increased. This fact implies that the data detection is insensitive to noise, for example, alpha rays. The increased amount of stored charges makes the holding time of data long.

Figure 9:
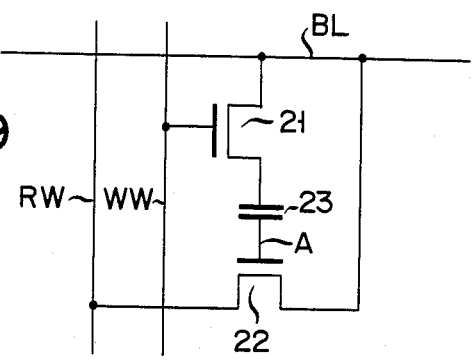
FIG. 9 is a circuit diagram of a memory cell according to another embodiment of this embodiment.

FIG. 9 shows a circuit diagram of a memory cell according to another embodiment of this invention. A difference of this embodiment from the FIG. 4 embodiment resides in that bit line WB for data write and bit line RB for data read-out are replaced by a single bit line BL. The remaining circuit arrangement is substantially the same as that of the FIG. 4 embodiment. Therefore, no further explanation will be given, with same reference symbols applied to same portions in FIG. 4.

FIGS. 10a to 10d to FIGS. 13a to 13d show timing charts illustrating the operation of the FIG. 9 memory cell.

Figure 10:
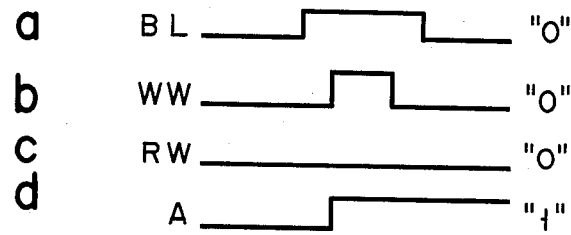
FIGS. 10a to 10d to FIGS. 13a to 13d show time charts illustrating the operation of the memory cell of FIG. 9.

FIGS. 10a to 10d show timing charts illustrating writing of logical "1" into the memory cell. During the write cycle, bit line BL is set at 5 V (FIG. 10a). During the period that bit line BL is at 5 V, word line WW is set to 5 V (FIG. 10b). As a result, 5 V on bit line BL is applied to point A and the signal charges representing logical "1" are loaded into point A (FIG. 10d). Word line RW is kept at 0 V (FIG. 10c).

Figure 11:
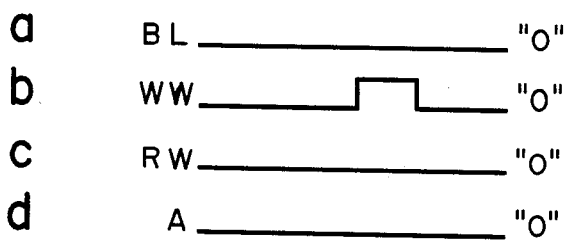

FIGS. 11a to 11d show timing charts for illustrating writing logical "0" into the memory cell. Bit line BL is kept at 0 V (FIG. 11a). During the write cycle, word line WW is set at 5 V (FIG. 11b), and bit line BL is kept at 0 V. Accordingly, no charge is applied to point A (FIG. 11b). This indicates that logical "0" is stored in point A. Word line RW is kept at 0 V.

Figure 12:
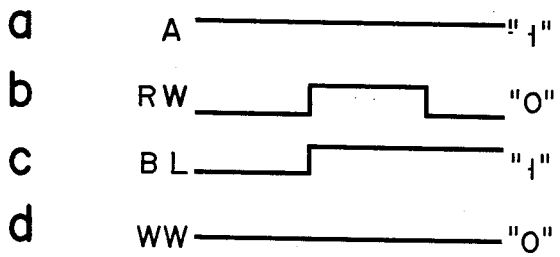

FIGS. 12a to 12d show timing charts of the memory cell operation when logical "1" data is read out of the memory cell. The point A potential is 5 V, i.e. logical "1" (FIG. 12a). During the read cycle, word line RW is set to 5 V (FIG. 12b). At this time, transistor 22 is in on state. Accordingly, 5 V is applied to bit line BL (FIG. 12c). In other words, logical "1" data appears on bit line BL. Word line WW is kept at 0 V (FIG. 12d).

Figure 13:
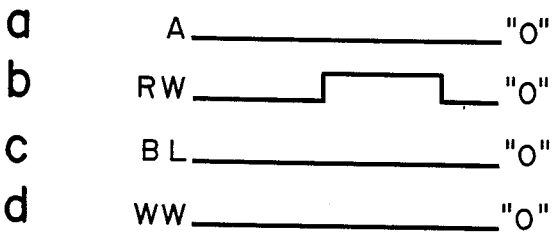

FIGS. 13a to 13d show timing charts for illustrating the operation of reading out logical "0" data from the memory cell. The point A potential has been set to 0 V, i.e., logical "0" (FIG. 13a). During the read cycle, word line RW is set to 5 V (FIG. 13b). At this time, transistor 22 is in off state. Accordingly, 0 V appears on bit line BL (FIG. 13c). Word line WW is kept at 0 V (FIG. 13d).

In this way, data write and read operations are performed.

Figure 14A:
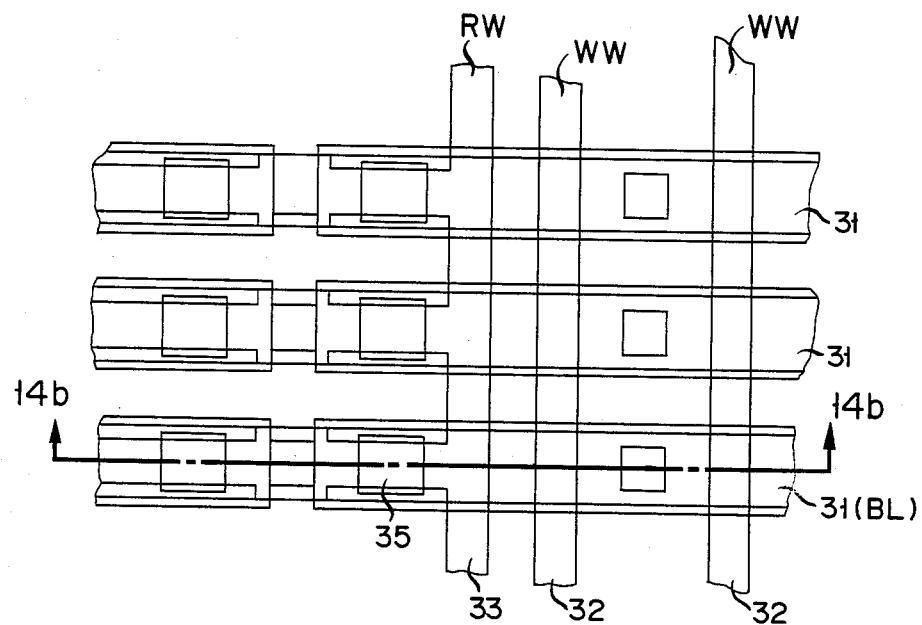
FIG. 14a shows a pattern plan view of a structural arrangement of the memory cell shown in FIG. 9.
Figure 14B:
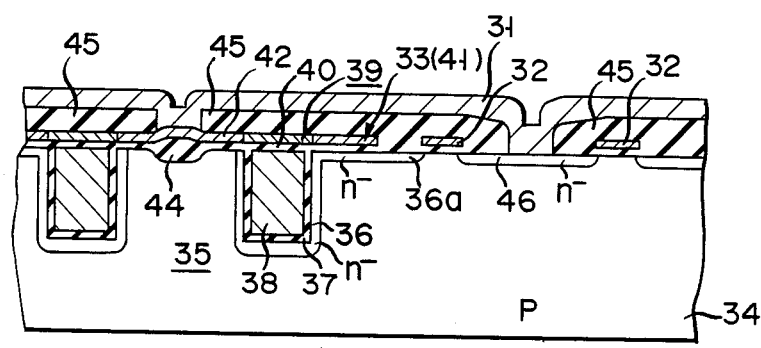
FIG. 14b shows a partial cross sectional view as taken along line 14b—14b in FIG. 14a and viewed in the arrow head direction.

FIG. 14a shows a pattern plan view of a structural arrangement of the memory cell shown in FIG. 9. FIG. 14b shows a cross sectional view taken on line 14b—14b in FIG. 14, and viewed in the direction of arrow head. Bit line BL is metal layer 31 made of, for example, aluminum. Word lines WW and RW are polysilicon layers 32 and 33, respectively. Polysilicon layers 32 and 33 are disposed orthogonal to aluminum layer 31. The gate electrode of transistor 21 is formed by a part of polysilicon layer 32. Capacitor 23 is comprised of an N− type semiconductor region 36 with a fixed thickness which is formed on the inner surface of trench 35 in P type silicon semiconductor substrate 34 and serves as one of the electrodes of capacitor 23, a silicon oxide film 37 which is deposited on the region 36 and serves as a dielectric, and a polysilicon layer 38 filled in trench 35 and formed on film 37, serving as the other electrode of capacitor 23. Region 36 extends over the surface of substrate 34 to provide an extended portion 36a. Portion 36a forms the source region of transistor 21. Insulating film 40 is formed over the surface of polysilicon layer 38. Polysilicon layer 39 is further formed over insulating film 40. N or P type impurity is contained in both ends 41 and 42 of layer 39. Portion 41 is continuous to polysilicon layer 33. Layer 38 also forms the gate electrode of transistor 22. Portions 41 and 42 form respectively the source and drain of transistor 22. Thus, transistor 22 is formed over capacitor 23. Layer 38 forming the gate electrode of transistor 22 is buried in semiconductor substrate 34. Portion 42 is connected to aluminum layer 31 above field oxide film 44. Portion 42 is connected to N+ region 46 as the drain of transistor 21, with aluminum layer 31 intervening therebetween. Reference numeral 45 designates a silicon oxide film, and separate layers 31, 32 and 39. While N+ region 46 forms the drain of one transistor 21 in FIG. 14b, it also serves as the drain of another transistor 21 (not shown) existing on the right side in FIG. 14b.

Figure 15A:
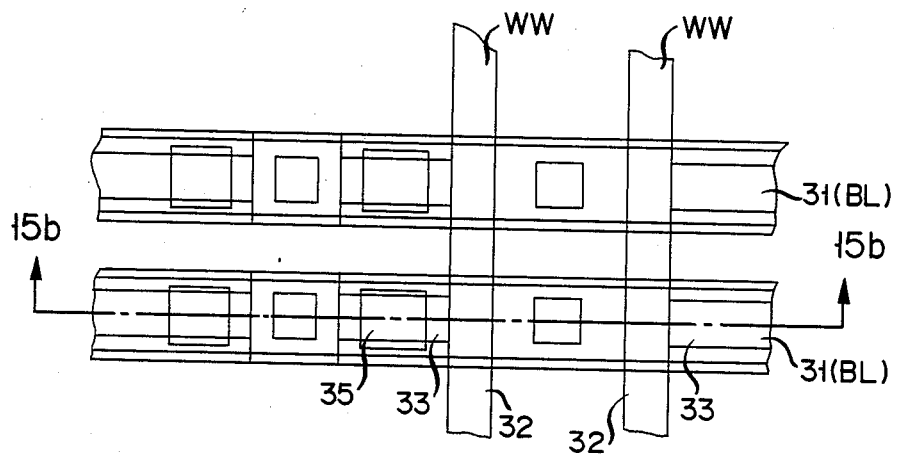
FIG. 15a shows a pattern plan view of another structural arrangement of the memory cell shown in FIG. 9.
Figure 15B:
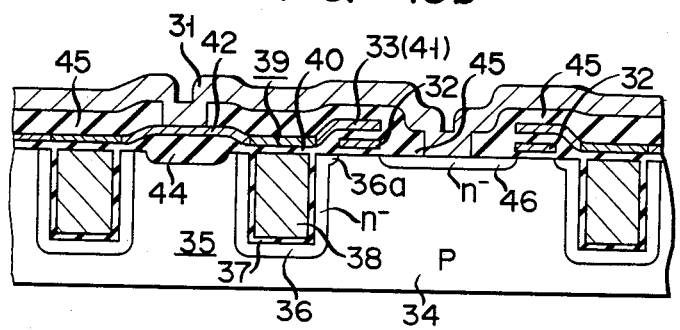
FIG. 15b shows a partial cross sectional view as taken along line 15b—15b in FIG. 15a and viewed in the arrow head direction.

FIG. 15a shows a pattern plan view of another structural arrangement of the memory cell of FIG. 9. FIG. 15b shows cross sectional view taken on line 15b—15b and viewed in the arrow head direction in FIG. 15a. A difference of this embodiment from the FIGS. 14a and 14b embodiment is that polysilicon portion 41 and polysilicon layer 32 overlap each other with silicon oxide film 45 sandwiched therebetween. This overlapping feature more reduces the chip area per cell than the FIGS. 14a and 14b embodiment.

FIGS. 16a to 16h show cross sectional views illustrating a sequence of steps for manufacturing the memory cell shown in FIGS. 15a and 15b.

Figure 16:
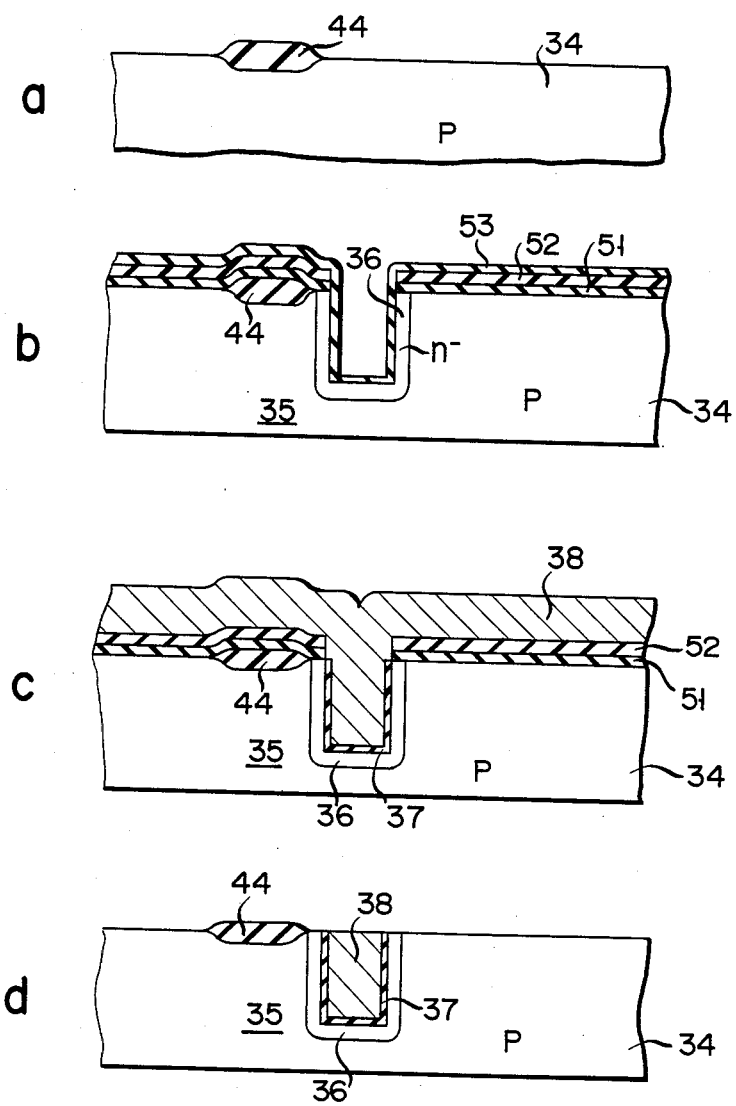
FIGS. 16a to 16h show cross sectional views illustrating a sequence of steps for manufacturing the memory cell shown in FIGS. 15a and 15b.
Figure 16:
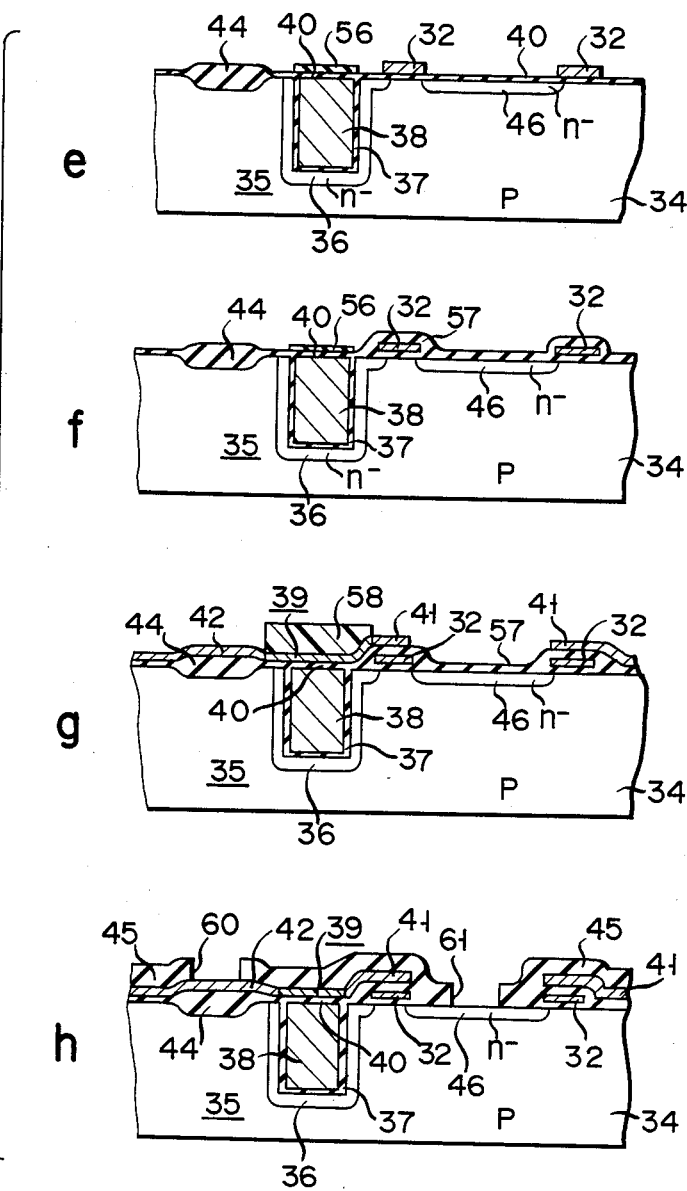

Step A (FIG. 16a)

P type silicon semiconductor substrate 34 is prepared. Field oxide film 33 for separating individual element regions is formed by known technique.

Step B (FIG. 16b)

Silicon nitrided film (Si₃N₄) and silicon oxide film (SiO₂) are successively deposited up to about 2000 Å and 5000 Å in thickness, respectively. A photoresist mask layer (not shown) is further deposited thereon. The mask layer is selectively etched away by photolithography technique to form opening at a region corresponding in location to trench 35. Through this process, a predetermined mask pattern is formed. By RIE (reactive ion etching) process using CF₄ gas, the multilayered film incluging films 51 and 52 is selectively etched away. Then, by the RIE process using Cl gas, semiconductor substrate 34 is selectively etched at the portion corresponding in location to trench 35, thereby to form trench 35. The mask layer is removed, and PSG (phosphorous silicate glass) is formed over the entire surface of the structure. Then, it is subjected to a heat-treatment to form N− type region 36 on the inner surface of trench 35 in semiconductor substrate 36.

Step C (FIG. 16c)

PSG film 53 is removed. Then, it is subjected to oxide processing for 10 minutes at 90020 C., to form silicon oxide film 37 with about 100 Å thickness on the inner surface of trench 35. Polysilicon is deposited to approximately 5000 Å in thickness over the entire surface of the structure. Phosphor is diffused into the deposited polysilicon at 900° C. using POCl₃, to form polysilicon layer 38.

Step D (FIG. 16d)

Using Cl gas, polysilicon layer 38 is uniformly and entirely etched, except polysilicon layer 38 in trench 35. Subsequently, the multilayered film is removed, which includes silicon nitrided film 51 and silicon oxide film 52.

Step E (FIG. 16e)

Silicon oxide film 40 to be the gate insulating film of transistor 21 is grown on the entire surface of the structure by thermal oxide process. A silicon nitride film is further formed on the entire surface of the structure. The silicon nitrided film is selectively removed by using a mask with a predetermined pattern, with silicon nitrided film 56 being exceptionally left above trench 35. Further, a polysilicon layer is formed on the entire surface of the structure, and selectively etched for patterning by using a predetermined mask, to form the gate of transistor 21 and polysilicon layer 32 adjacent the gate. Following this, As (arsenic) is ion implanted into substrate 34 to form N⁻ region 46.

Step F (FIG. 16f)

The structure is then subjected to wet oxidation process at 900° C., so that the surfaces of polysilicon layer 32 and silicon substrate 34 are oxidized to form silicon oxide film 57.

Step G (FIG. 16g)

Polysilicon is entirely deposited on the surface of the structure. The polysilicon layer is selectively removed to form polysilicon layer 39 with an opening on N⁻ region 46. Subsequently, resist mask 58 is formed on the portion polysilicon layer 39 where is located above trench 35. Using mask 58, aresenic ion is injected into silicon substrate 34, thereby to form both end portions 41 and 42 of polysilicon layer 39, which serve as the source and drain of transistor 22.

Step H (FIG. 16h)

Insulating film 45 is formed on the entire surface of the structure, and then subjected to a predetermined patterning, thereby to form an opening 60 communicating with polysilicon portion 42 and opening 61 communicating with N⁻ region 46.

Step I (FIG. 15b)

Aluminum is vapor deposited on the entire surface of the structure and patterned, to form bit line layer 31 as shown in FIG. 15b.

Through the sequence of the above process steps, the memory cell shown in FIGS. 15a and 15b is manufactured.

Figure 17A:
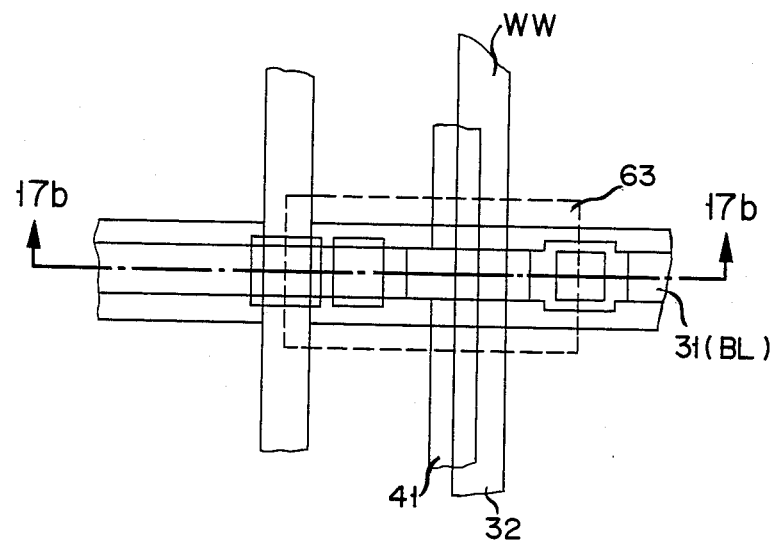
FIG. 17a shows a plan view of another structural arrangement of the memory cell shown in FIG. 9.
Figure 17B:
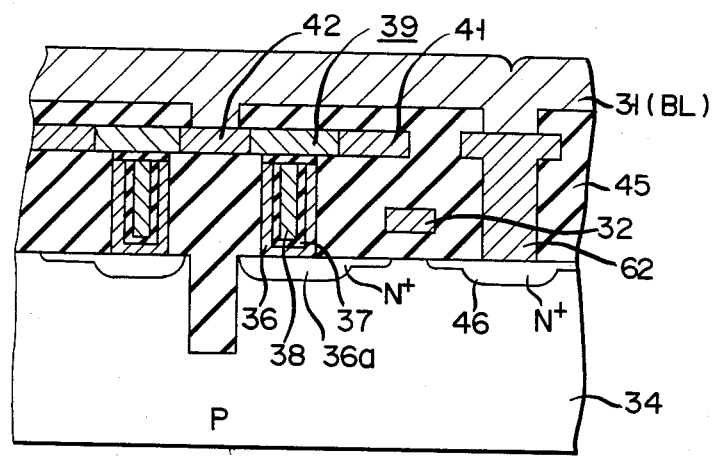
FIG. 17b shows a cross sectional view as taken along line 17b—17b in FIG. 17a and viewed in the direction of arrow head.

FIG. 17a shows a pattern plan view of another structure of the memory cell shown in FIG. 9. FIG. 17b shows a cross sectional view as taken along line 17b—17b in FIG. 17a. In this embodiment, capacitor 23 is a trench capacitor as in the previous embodiment, but is formed in the trench of insulating film 45 on the silicon substrate 34, and not in the substrate 34. Transistor 22 is formed above trench capacitor 23, using polysilicon or monosilicon. Same reference numerals are used for designating same portions in the figures in the previous embodiments.

In the above embodiments of FIGS. 14a and 14b, and 15a and 15b, the drain region 46 of transistor 21 is directly connected to aluminum layer 31 forming bit line BL. In this embodiment, it is connected to aluminum layer 31 through polysilicon layer 62. Polysilicon layer 32 forms the gate electrode of transistor 21 and word line WW. Capacitor 23 includes N⁺ polysilicon region 36 formed with a fixed thickness on the inner surface of trench 35, which is formed in silicon oxide film 45, silicon oxide film 37 serving as a dielectric, which deposited on N⁺ polysilicon region 36, and polysilicon layer 38 filled in trench 35 and formed on silicon oxide film 37. The transistor 22 for reading out data is formed by polysilicon layer 39 on capacitor 23. Specifically, both end portions 41 and 42 of polysilicon layer 39 constitute the source and drain of transistor 22. The gate electrode of transistor 22 has polysilicon layer 38 forming one of the electrodes of trench capacitor 23. In FIG. 17a, a block 63 by dotted line forms one memory cell.

FIGS. 18a to 18d show cross sections for illustrating a sequence of steps for manufacturing the memory cell structurally shown in FIGS. 17a and 17b.

Figure 18:
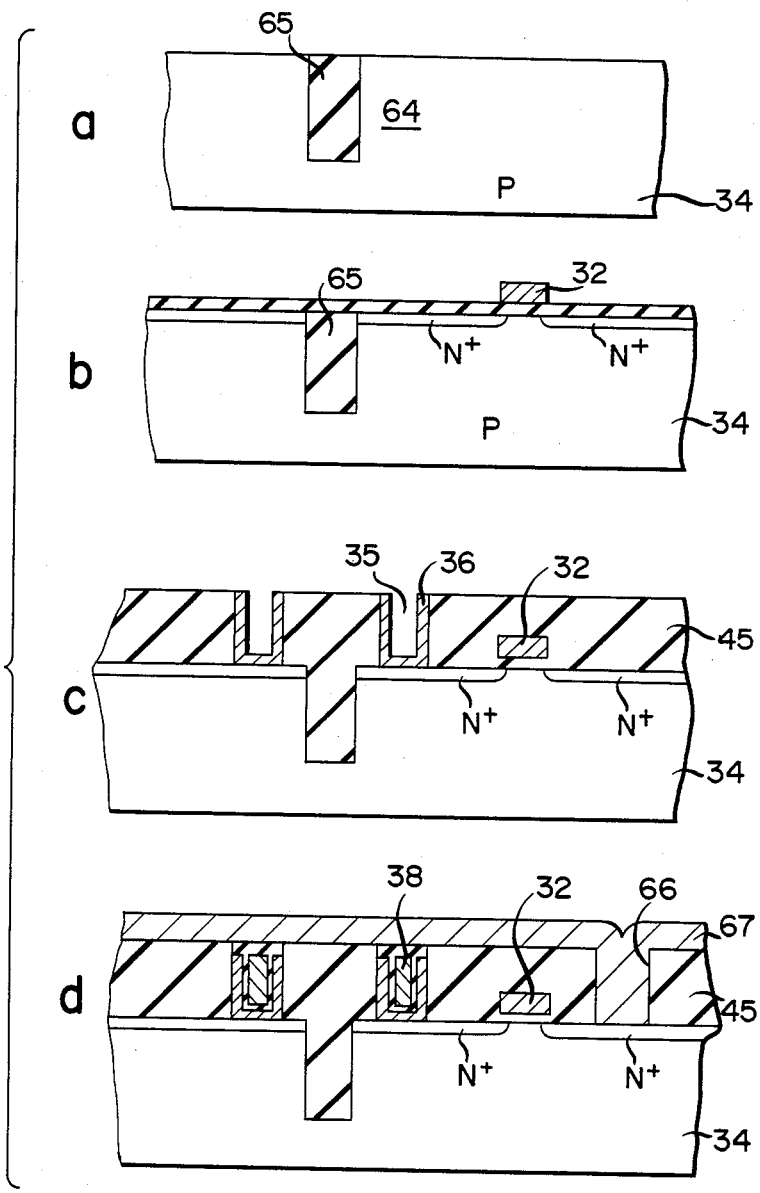
FIGS. 18a to 18d show cross sectional views illustrating a sequence of steps for manufacturing the memory cell shown in FIGS. 17a and 17b.

Step A (FIG. 18a)

A trench 64 is formed in P type silicon substrate 34 by known masking process and etching process. Trench 64 is formed through isotropical etching of substrate 34 by using Cl gas. Subsequently, by using spattering process, silicon oxide film is formed on the entire surface of the structure. Then, the silicon oxide film is uniformly etched away except the silicon oxide film 65 in trench 35.

Step B (FIG. 18b)

The gate oxide film is formed on substrate 34, and a polysilicon layer to be used as the gate electrode of transistor is formed on the gate oxide film. It is then patterned to form polysilicon layer 32 serving as the gate electrode of tranistor 21. Using polysilicon layer 32 as a mask, As (arsenic) is ion implanted into substrate 34, to form N⁺ regions to be used as the source and drain regions of transistor 21.

Step C (FIG. 18c)

A thick silicon oxide film 45 is formed on the entire surface of the structure. Further, by using known technique, trench 35 is formed in the portion of oxide film 45 where the trench capacitor is to be formed. The trench 35 reaches the surface of substrate 34. Polysilicon is deposited on the entire surface of the structure, the As (arsenic) is diffused into the polysilicon layer. Then, the polysilicon layer is selectively etched with only the polysilicon layer being left on the inner surface of trench 35. This left polysilicon layer is polysilicon layer 36.

Step D (FIG. 18d)

The structure is then subjected to a thermal oxidation, to form silicon oxide film 37 on the polysilicon layer 36. Polysilicon is entirely deposited on the surface of the structure, and As (arsenic) is ion diffused into the deposited polysilicon. The polysilicon layer is uniformly etched while the polysilicon layer 38 is left only in trench 35. The surface of polysilicon layer 38 is oxidized, to form a silicon oxide film on the surface of polysilicon layer 38. A resist film is formed having an opening at the portion thereof corresponding in location to the N⁺ region serving as the drain of transistor 21. Opening 66 communicating with the drain N⁺ region of silicon oxide film 45 is formed by using the resist film as a mask. After the formation of opening 66, P type polysilicon layer 67 is formed on the entire surface of the structure. Polysilicon 62 extends into contact hole 66 and contacts the drain N⁺ region.

Step E (FIG. 17b)

A resist film with a predetermined pattern is formed. As (arsenic) is ion implanted into the polysilicon layer, using the mask of the resist film, to form N+ portions 41 and 42 at both sides of polysilicon layer 39, as shown in FIG. 17b. A resist mask with a predetermined pattern is formed. Using this mask, polysilicon layer 67 is separated into polysilicon layer 39 and polysilicon layer 62, as shown in FIG. 17b. A silicon oxide film is formed on the entire surface of the structure, and a contact hole is formed at a predetermined location of the silicon oxide film. Further, aluminum is deposited over the entire surface to connect N+ region 46 and N+ portion 41, and to form bit line 31.

The embodiment of FIGS. 17a and 17b may attain substantially the same effects as those of the embodiment of FIGS. 14a and 14b. In this embodiment, as described above, a trench capacitor is used for capacitor 23 and transistor 22 is located superposing on capacitor 23. This feature of this embodiment improve a packing density of the memory device. Further, even if a number of memory cells are connected to the bit line, a satisfactory amount of signal charges may be read out onto the bit line. Since capacitor 23 is formed by the trench capacitor, its capacitance is large and can store a large amount of charges. This feature guarantees the correct operation of memory cell against noise interference and provides a long data holding time.

Figure 19A:
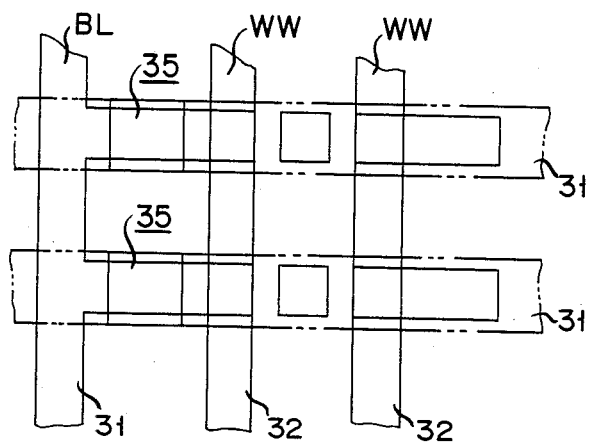
FIG. 19a shows a pattern plan view illustrating another structural arrangement of the memory cell of FIG. 9.
Figure 19B:
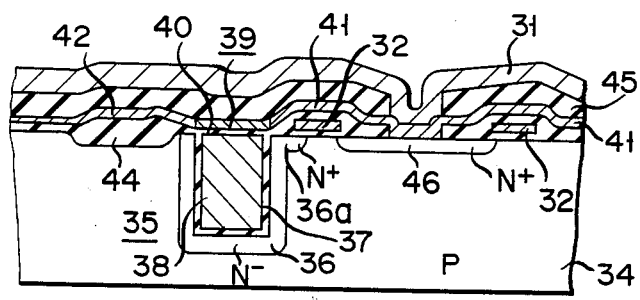
FIG. 19b shows a cross sectional view as taken along line 19b—19b in FIG. 19a and viewed in the arrow head direction.

FIGS. 19a and 19b show another structural arrangement of the memory cell of FIG. 9. FIG. 19a shows a pattern plan view of the memory cell, and FIG. 19b a cross sectional view taken on line 19b—19b in FIG. 19a.

This embodiment is different from the embodiment of FIGS. 15a and 15b in that polysilicon layer 39 is not separated between transistors 21 and 22, but is continuous. In this embodiment, polysilicon layer 39 extends over substrate 34 in the direction from region 41 as the source of transistor 22 toward transistor 21. Further, it passes through contact hole in silicon oxide film 45, and contacts N+ region 46 as the drain of transistor 21. Polysilicon layer 39 crosses over polysilicon layer 32 to extend under oxide film 45. As seen from FIG. 19a, bit line BL is connected to the source or drain of transistor 21, through a contact hole common to two adjacent memory cells. Word line WW is common to two adjacent memory cells.

The manufacturing steps A to E of this embodiment are equal to those of the embodiment of FIGS. 15a and 15b. Hence, only manufacturing steps F to H of this embodiment will be given.

Figure 20:
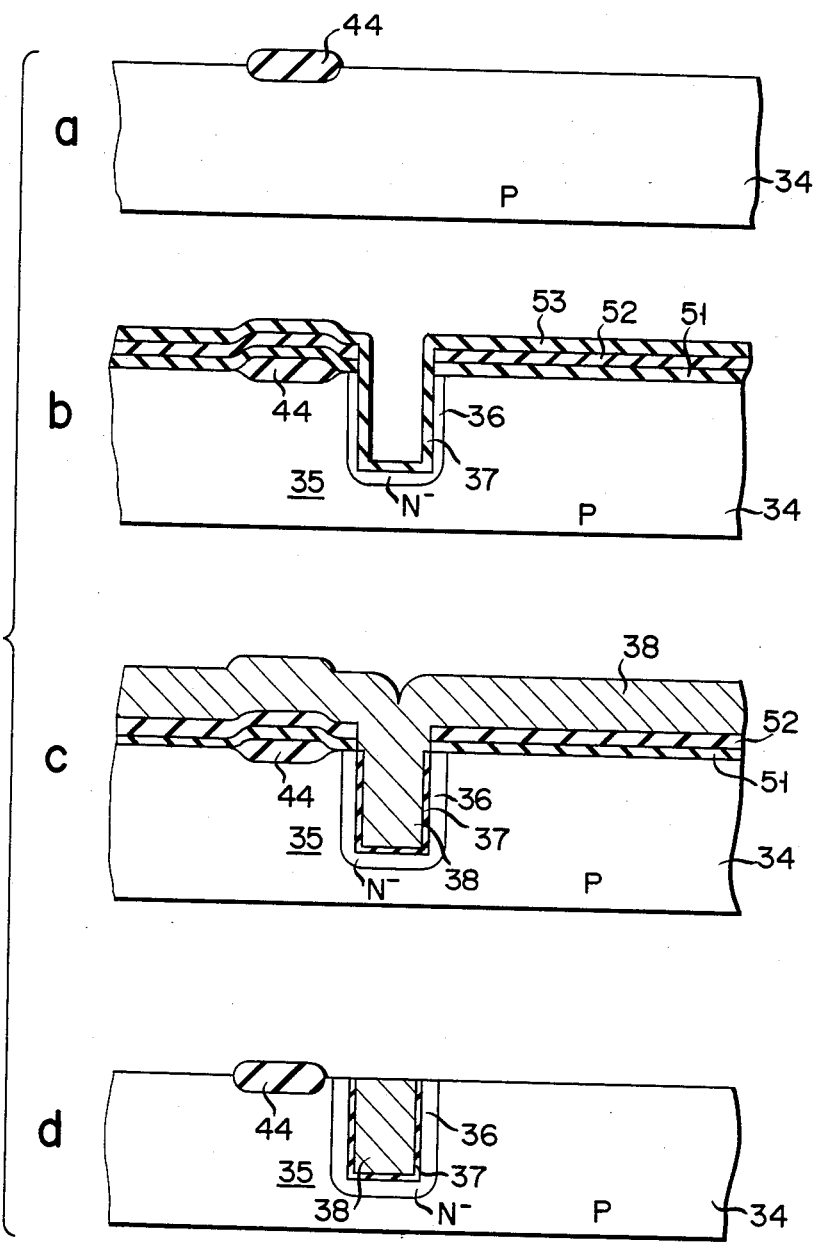
FIGS. 20a to 20h show cross sectional views illustrating a sequence of steps for manufacturing the memory cell shown in FIGS. 19a and 19b.
Figure 20:
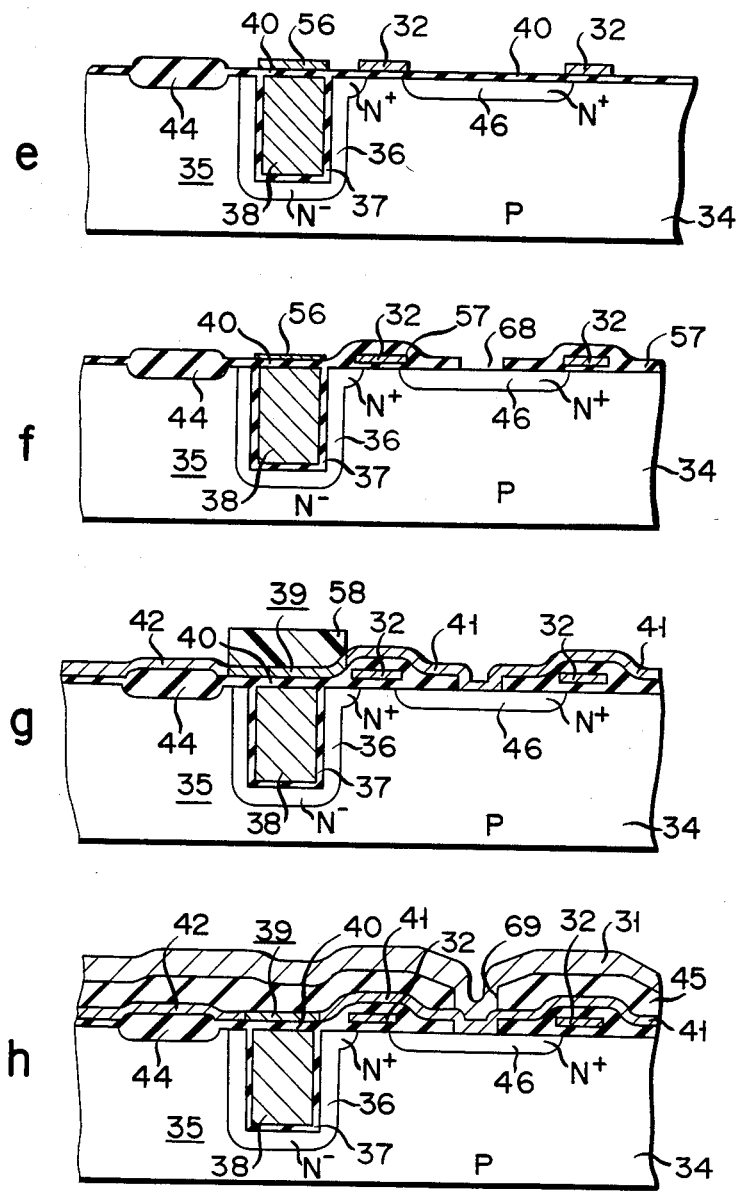

Step F (FIG. 20f)

The structure is subjected to wet oxidation at 900° C., to oxidize the surfaces of silicon substrate 34 and polysilicon layer 32. Succeedingly, contact hole 68 is formed at a portion of oxide film 57 corresponding in location to the region 46 of transistor 21.

Step G (FIG. 20g)

After removal of silicon nitride film 56, polysilicon is deposited over the entire surface of the structure. Then, the deposited polysilicon is patterned, to form polysilicon layer 39. Resister film 58 is formed on a region of polysilicon layer 39 corresponding in location to the trench capacitor. Using the resist film 58 as a mask, arsenic (As) is ion implanted into polysilicon layer 39. Laser irridation then applied single crystallizes polysilicon layer 39. The structure is annealed, so that the portions 41 and 42 of the polysilicon layer in the region where resist film 58 is formed, respectively serve as the N+ source region and drain region of transistor 22.

Step H (FIG. 20h)

After removal of resist film 58, silicon oxide film 45 is formed on the entire surface of the structure. A contact hole 69 is formed at a location of silicon oxide film 45 corresponding to contact hole 68. Then, aluminum deposition is applied to the entire surface of the structure. The deposited aluminum is patterned to form bit line 31. Bit line 31 extends into contact hole 69 and contacts with drain N+ region 46. Also in this embodiment, a large amount of signal charges may be read out onto bit line, as in the embodiment of FIGS. 15a and 15b. A packing density of memory cells in the semiconductor chip may be improved. Because of the large amount of charges, the memory cell operation is stable against noise and elongates the data holding time.

Figure 21:
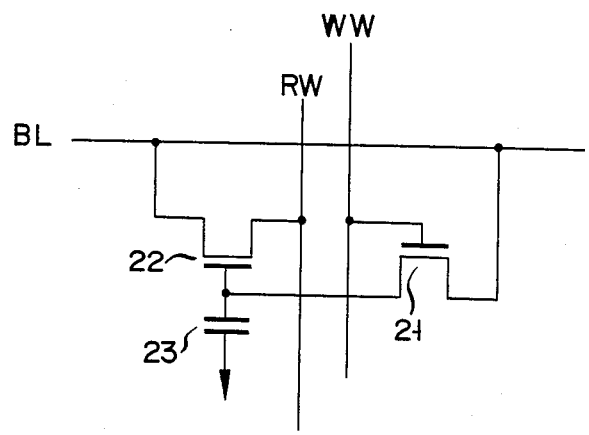
FIG. 21 shows a circuit diagram of a memory cell according to another embodiment of the present invention.

FIG. 21 is a circuit diagram of yet another embodiment of this embodiment. This embodiment is different from that of FIG. 9 in that the source of transistor 21 is connected to the gate of transistor 22 directly, not through capacitor 23, and that one of the electrodes of capacitor 23 is connected to the gate of transistor 22, while the other electrode to reference potential as ground potential. The remaining circuit arrangement is substantially equal to that of FIG. 9.

Figure 22:
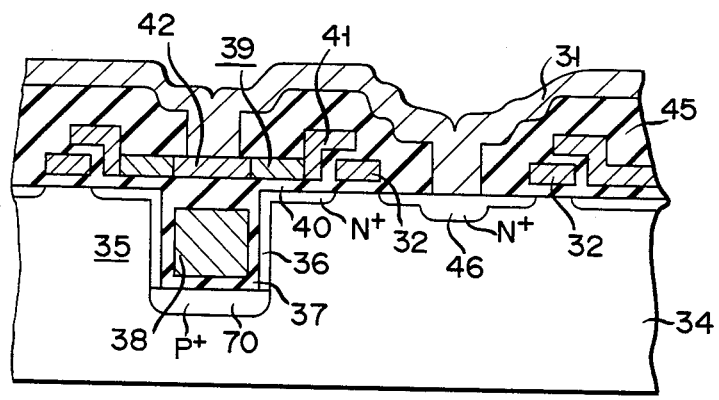
FIG. 22 shows a cross sectional view of a structure of the memory cell of FIG. 21.

FIG. 22 shows a structural arrangement of the memory cell having a circuit arrangement shown in FIG. 21. This embodiment is different from that of FIG. 15b in that the portion of N− region 36 extending along the surface of substrate 34, forms the gate electrode of transistor 22, the portion of polysilicon layer 39 corresponding to the gate electrode forms the transistor 22, and the portions 41 and 42 of polysilicon layer 39 located on both sides of the channel region forms the source and drain regions of the transistor. Additional difference of this embodiment is the P+ type impurity layer 70 for separating adjacent memory cells is formed under trench capacitor 23.

Also in this embodiment, the packing density is high, a large amount of signal charges may be read out into the bit line. The memory cell operation is stable against noise such as alpha rays.

While in the above embodiments, $SiO_2$ is used for the gate oxide film of transistor 22 and the oxide film of capacitor 23, it may be $Si_3N_4$ or the combination of $SiO_2$ and $Si_3N_4$.

Alternatively, the electrode buried in the trench may be made of polysilicon containing little impurity, the polysilicon may be used for dielectric.

Aluminum of the bit line may be replaced by polysilicon or metal silicide. Metal or metal silicide is applicable for the bit line for signal write and the word line.

Figure 23:
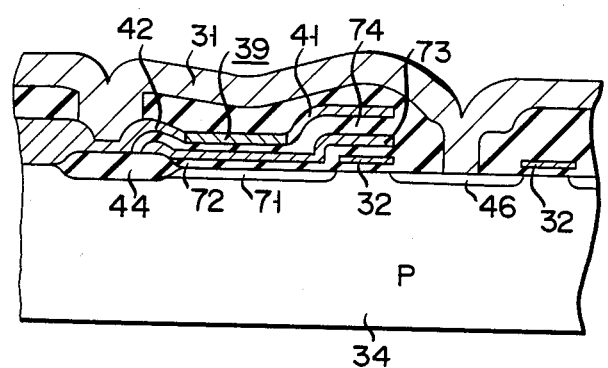
FIG. 23 shows a cross sectional view of another structural arrangement of the memory cell of FIG. 9.

Further modifications are allowed within the spirit of this invention. In the above embodiments, a trench capacitor is used for capacitor 23 in order to increase its capacitance. The capacitor 23 may be formed on a plain surface, as shown in FIG. 23. In FIG. 23, reference numeral 71 designates an N− semiconductor region formed on the surface of substrate 34. Polysilicon layer 73, which is to be used as one of the electrodes of capacitor 23, is laid above semiconductor region 71, with silicon oxide film 72 of dielectric intervening therebetween. Polysilicon layer 39 is laid above polysilicon layer 73, sandwiching insulating film 74. The polysilicon layer serves as one of the electrodes of capacitor 23 and the gate electrode of transistor 22. Thus, the gate electrode of transistor 22 is laid in parallel with the main surface of substrate 34. The capacitor 23 thus constructed has a smaller capacitance than the trench capacitor.

The bit line and word line for signal writing may be made of compound which is formed through chemical reaction of metal and silicon.

Polysilicon for the source and drain of transistor 22 may be substituted by silicon crystallized by laser annealing or lamp annealing.

As described above, according to the present invention, there is provided a dynamic type semiconductor memory device which may improve the packing density and may read out a large amount of singal charges onto the bit line.

What is claimed is:

1. A semiconductor memory cell comprising:
    a bit line for writing data;
    a word line for writing data;
    a bit line for reading out data;
    a word line for reading out data;
    a MOS transistor for writing data, one terminal of the drain-source path of the MOS transistor being connected to said bit line for writing data, and the gate electrode of the MOS transistor being connected to said word line for writing data;
    a capacitor for storing charges, one electrode of the capacitor being connected to the other terminal of the drain-source path of the MOS transistor; and
    a MOS transistor for reading out data, one terminal of the drain-source path of the MOS transistor being connected to said bit line for reading out data, the other terminal of the drain-source path of the MOS transistor being connected to said word line for reading out data, and the gate electrode of the MOS transistor being connected to the other electrode of said capacitor.

2. A semiconductor memory cell according to claim 1, wherein said bit line for writing data and said bit line for reading out data are common.

3. A semiconductor memory cell according to claim 1, wherein said MOS transistor for writing data and said MOS transistor for reading out data are formed by MOS transistor.

4. A semiconductor memory cell according to claim 1, wherein said bit line for reading out data is shared by two memory cells.

5. A semiconductor memory cell according to claim 1, wherein said MOS transistor for reading out data is made of polysilicon formed on a semiconductor substrate.

6. A semiconducdor memory cell according to claim 5, wherein said gate of said MOS transistor for reading out data is provided in said semiconductor substrate.

7. A semiconductor memory cell according to claim 5, wherein said gate of said MOS transistor for reading out data is provided on said semiconductor substrate.

8. A semiconductor memory cell according to claim 1, wherein a dielectric film of said capacitor is formed of a polysilicon film provided in said semiconductor substrate.

9. A semiconductor memory cell according to claim 1, wherein said word line for writing data and said word line for reading out data are crossed with an insulation film therebetween.

10. A semiconductor memory cell according to claim 1, wherein a part of said bit lines and said word lines is made of metal.

11. A semiconductor memory cell according to claim 1, wherein a part of said bit lines and said word lines is made of metal silicide.

12. A semiconductor memory cell according to claim 1, wherein said bit line for writing data and said bit line for reading out data are connected together.

13. A semiconductor memory cell according to claim 1, in which said gate electrode of said MOS transistor for reading out data is formed on a semiconductor substrate, and said bit line and word line for reading out data are made of polysilicon.

14. A semiconductor memory cell according to claim 1, in which said gate electrode of said MOS transistor for reading out data is formed on a semiconductor substrate, and said bit line and word line for reading out data are made of single crystal silicon.

15. A semiconductor memory cell according to claim 1, wherein said capacitor is a trenched capacitor formed on a semiconductor substrate, and said MOS transistor for reading out data has a polysilicon layer formed on said trenched capacitor, the gate electrode of said MOS transistor for reading out data being formed by an electrode of said trenched capacitor.

16. A semiconductor memory cell according to claim 1, wherein said capacitor is a trenched capacitor formed on a semiconductor substrate, and said MOS transistor for reading out data has a single crystal layer formed on said trenched capacitor, the gate electrode of said MOS transistor for reading out data being formed by an electrode of said trenched capacitor.

17. A semiconductor memory cell comprising:
    a bit line for writing data and reading out data;
    a word line for writing data;
    a word line for reading out data;
    a MOS transistor for writing data, one terminal of the drain-source path of the MOS transistor being connected to said bit line, and the gate electrode of the MOS transistor being connected to said word line for writing data;
    a capacitor for storing charges, one electrode of the capacitor being connected to the other terminal of the drain-source path of the MOS transistor, and the other electrode of the capacitor being connected to a predetermined potential; and
    a MOS transistor for reading out data, one terminal of the drain-source path of the MOS transistor being connected to said bit line, the other terminal of the drain-source path of the MOS transistor being connected to said word line for reading out data, and the gate electrode of the MOS transistor being connected to said one electrode of said capacitor.

18. A semiconductor memory cell according to claim 17, in which said capacitor is a trenched capacitor formed on a semiconductor substrate, and said MOS transistor for reading out data has a polysilicon layer formed on said trenched capacitor.

* * * * *